United States Patent
Hoshino et al.

(10) Patent No.: US 9,996,916 B2
(45) Date of Patent: Jun. 12, 2018

(54) EVALUATION METHOD, STORAGE MEDIUM, EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventors: Tomohiro Hoshino, Utsunomiya (JP); Ryo Sasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/227,355

(22) Filed: Aug. 3, 2016

(65) Prior Publication Data

US 2017/0045825 A1 Feb. 16, 2017

(30) Foreign Application Priority Data

Aug. 10, 2015 (JP) ................................ 2015-158496

(51) Int. Cl.
*G06T 7/00* (2017.01)
*G03F 7/20* (2006.01)
*G06T 5/00* (2006.01)

(52) U.S. Cl.
CPC ............ *G06T 7/0004* (2013.01); *G03F 7/706* (2013.01); *G03F 7/7085* (2013.01);
(Continued)

(58) Field of Classification Search
CPC .......................... G01M 11/0264; G03F 7/705; G03F 7/70516; G03F 7/70591; G03F 7/706;
(Continued)

(56) References Cited

U.S. PATENT DOCUMENTS 4,629,313 A * 12/1986 Tanimoto ................ G03F 7/706
355/53
2011/0181855 A1* 7/2011 Bittner ................ G03F 7/70266
355/55

FOREIGN PATENT DOCUMENTS

| CN | 1722001 A | 1/2006 |
| CN | 102165371 A | 8/2011 |
| JP | 6358349 A | 3/1988 |

OTHER PUBLICATIONS

Office Action issued in Chinese Application No. 201610649120.3 dated Feb. 5, 2018. English translation provided.

* cited by examiner

*Primary Examiner* — Colin Kreutzer
(74) *Attorney, Agent, or Firm* — Rossi, Kimms & McDowell LLP

(57) ABSTRACT

The present invention provides an evaluation method of evaluating optical characteristics of a projection optical system by obtaining, by a prediction formula, a predicted value for a fluctuation amount of the optical characteristics relative to an exposure period of a substrate via the projection optical system, the method comprising determining the prediction formula by using a dedicated pattern in which a plurality of marks are arranged in a matrix on an object plane of the projection optical system, wherein the determining includes selecting, from the plurality of marks, at least two marks located in an illuminated region to be formed on the object plane when exposing the substrate, and obtaining the prediction formula based on positions of images of the at least two marks formed on an image plane of the projection optical system.

14 Claims, 8 Drawing Sheets

(52) U.S. Cl.
CPC ...... *G03F 7/70591* (2013.01); *G03F 7/70666* (2013.01); *G03F 7/70683* (2013.01); *G03F 7/70891* (2013.01); *G06T 5/006* (2013.01); G06T 2207/10056 (2013.01); G06T 2207/30148 (2013.01); G06T 2207/30208 (2013.01)

(58) Field of Classification Search
CPC ............ G03F 7/70666; G03F 7/70683; G03F 7/7085; G03F 7/70891; G06T 5/006; G06T 7/004; G06T 2207/10056; G06T 2207/30148; G06T 2207/30208
USPC ................... 355/52, 55, 67, 68, 77; 356/124
See application file for complete search history.

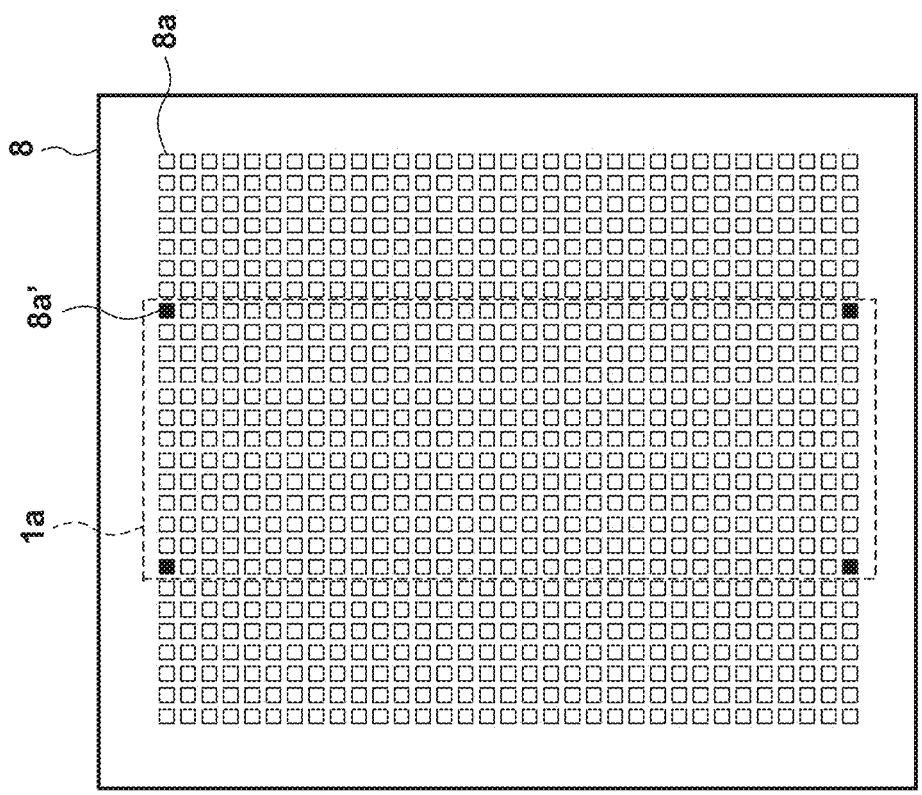
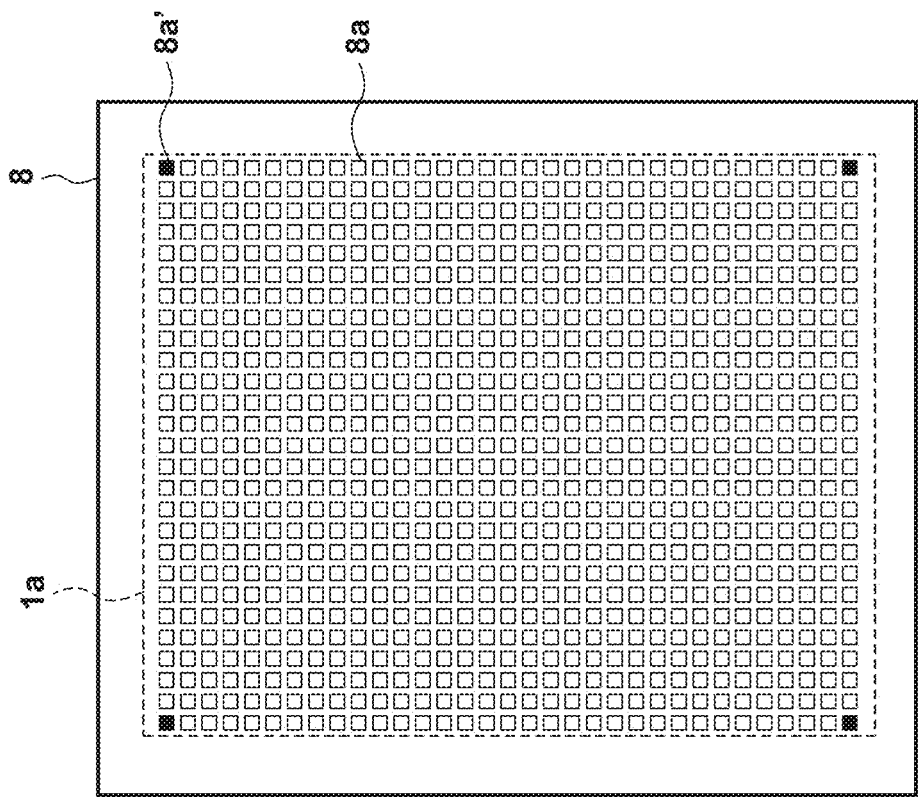

EVALUATION METHOD, STORAGE MEDIUM, EXPOSURE APPARATUS, EXPOSURE METHOD, AND METHOD OF MANUFACTURING ARTICLE

BACKGROUND OF THE INVENTION

Field of the Invention

The present invention relates to an evaluation method for evaluating optical characteristics, a storage medium, an exposure apparatus, an exposure method, and a method of manufacturing an article.

Description of the Related Art

As one apparatus used in the manufacturing step (lithography step) of semiconductor devices and the like, there is an exposure apparatus which transfers a pattern of an original to a shot region on a substrate. In the exposure apparatus, a part of exposure light is absorbed in a projection optical system, and thus optical characteristics of the projection optical system may fluctuate under the influence of heat generated by the absorption. As a result, it may become difficult to transfer the pattern of the original to the shot region accurately.

Japanese Patent Laid-Open No. 63-58349 proposes a method of predicting a fluctuation amount of the optical characteristics of the projection optical system by using a model formula having an exposure amount, an exposure period, and the like as variables and controlling the optical characteristics of the projection optical system based on a predicted value. Japanese Patent Laid-Open No. 63-58349 also proposes a method of measuring the fluctuation amount of the optical characteristics, and determining a prediction formula based on an actually measured value and the predicted value so as to reduce errors generated in the predicted value.

In Japanese Patent Laid-Open No. 63-58349, the fluctuation amount of the optical characteristics is actually measured by using a mark on the original having a circuit pattern that should be transferred to the shot region. It is therefore impossible to detect an image of the mark in a region, on an image plane of the projection optical system, onto which the circuit pattern is projected. As a result, accurate determination of the prediction formula so to reduce the errors generated in the predicted value may be performed inadequately.

SUMMARY OF THE INVENTION

The present invention provides, for example, a technique advantageous in predicting a fluctuation amount of optical characteristics of a projection optical system accurately.

According to one aspect of the present invention, there is provided an evaluation method of evaluating optical characteristics of a projection optical system by obtaining, by a prediction formula, a predicted value for a fluctuation amount of the optical characteristics relative to an exposure period of a substrate via the projection optical system, the method comprising: determining the prediction formula by using a dedicated pattern in which a plurality of marks are arranged in a matrix on an object plane of the projection optical system, wherein the determining includes selecting, from the plurality of marks, at least two marks located in an illuminated region to be formed on the object plane when exposing the substrate, and obtaining the prediction formula based on positions of images of the at least two marks formed on an image plane of the projection optical system.

Further features of the present invention will become apparent from the following description of exemplary embodiments with reference to the attached drawings.

BRIEF DESCRIPTION OF THE DRAWINGS

FIG. 8A is a view showing the illuminated region and the selected marks in the second original;

FIG. 8B is a view showing the illuminated region and the selected marks in the second original;

DESCRIPTION OF THE EMBODIMENTS

Figure 1:
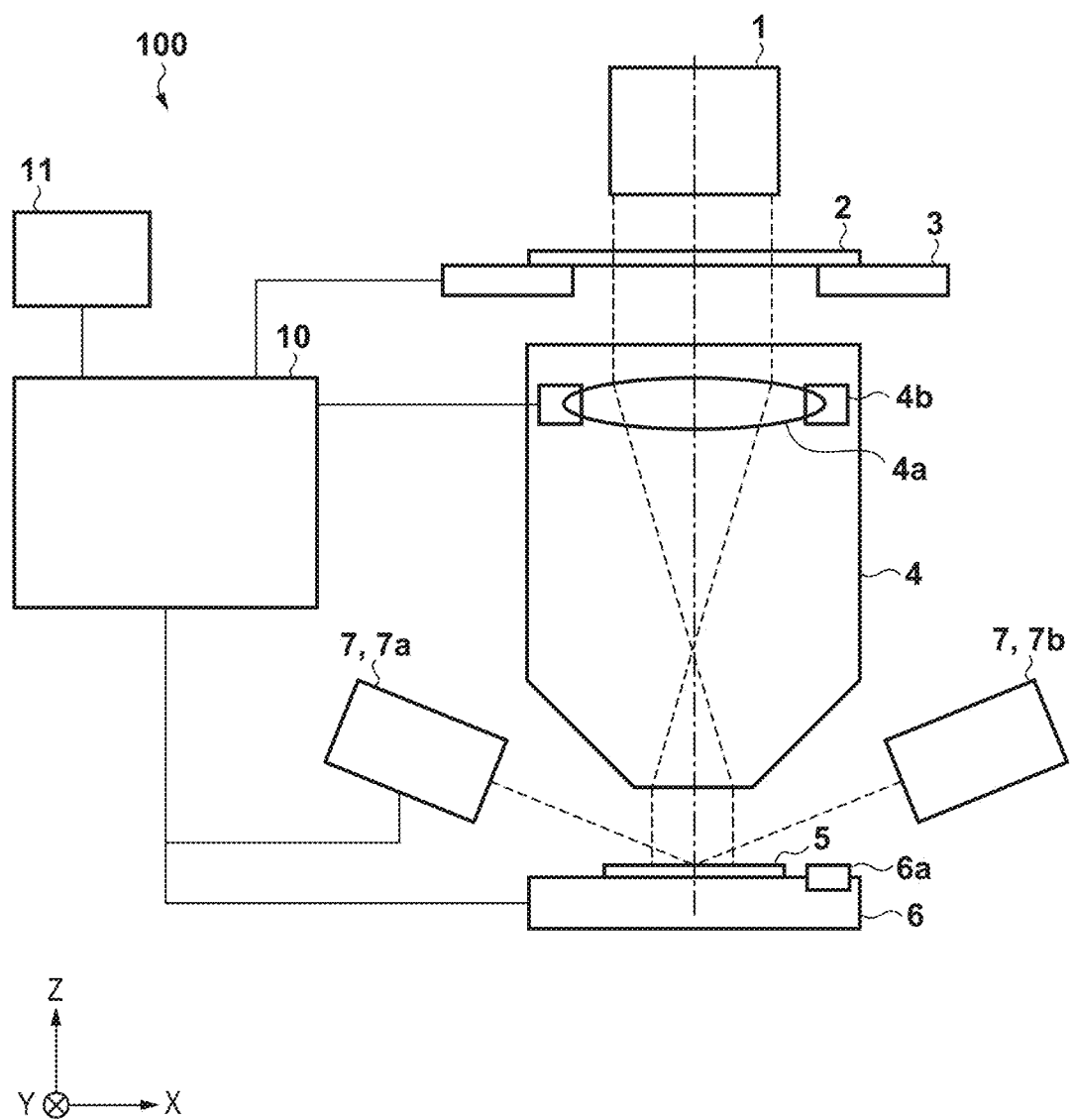
FIG. 1 is a schematic view showing an exposure apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An exposure apparatus 100 according to the first embodiment of the present invention will be described with reference to FIG. 1. FIG. 1 is a schematic view showing the exposure apparatus 100 according to the first embodiment. The exposure apparatus 100 can include, for example, an illumination optical system 1, an original stage 3 (holding unit) which holds an original 2, a projection optical system 4, a substrate stage 6 (stage) that can move while holding a substrate 5, and a control unit 10. The control unit 10 includes, for example, a CPU and a memory, and controls a process of transferring a pattern of the original 2 to a shot region on the substrate 5 (controls the respective units of the exposure apparatus 100).

The illumination optical system 1 shapes light emitted from a light source (not shown) by using a light-shielding member such as a masking blade included in the system and illuminates a part of the original 2 with the shaped light. The part of the original 2 illuminated by the illumination optical system 1 will be referred to as an "illuminated region 1a" hereinafter. The original 2 and the substrate 5 are held by the original stage 3 and the substrate stage 6, respectively, and are located at optically almost conjugate positions (object plane and image plane of the projection optical system 4) via the projection optical system 4. The projection optical system 4 projects the pattern of the original 2 onto the substrate 5 (shot region).

Figure 2:
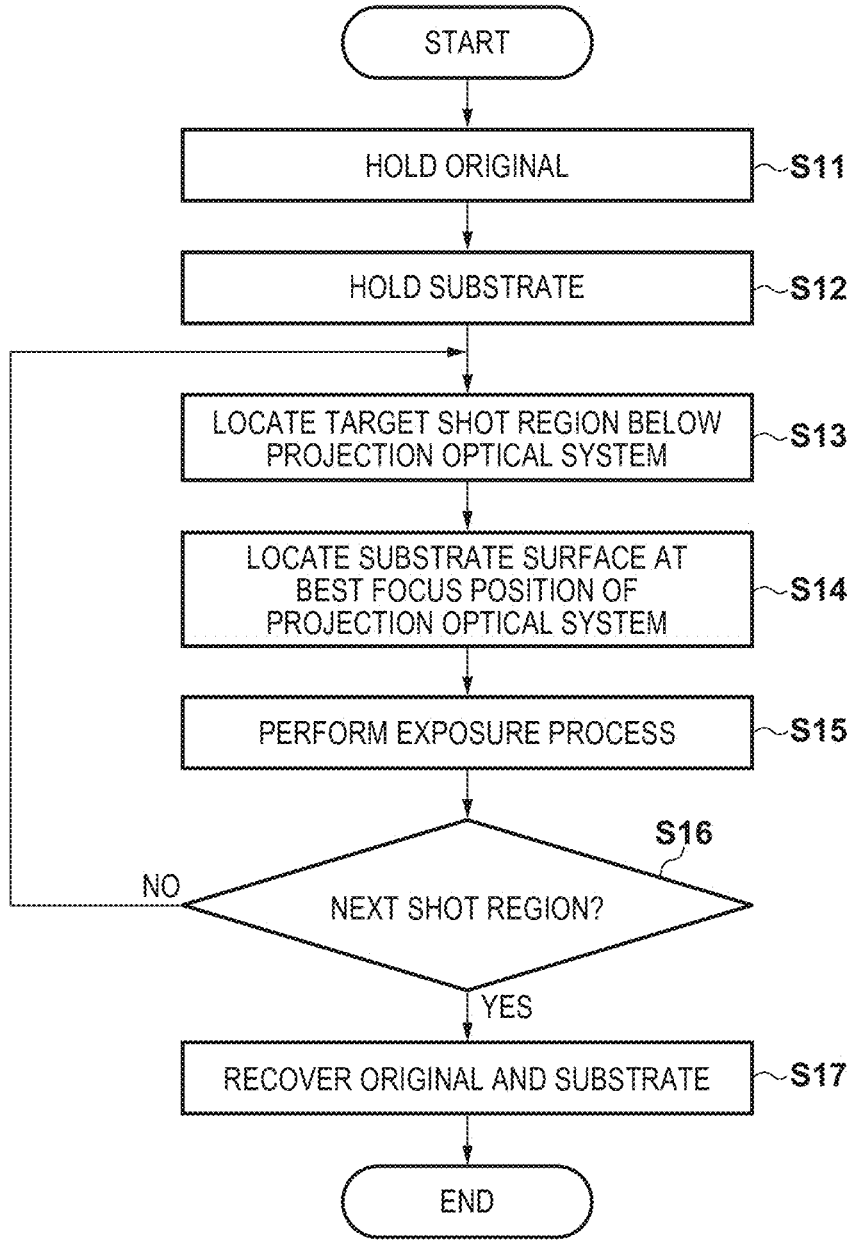
FIG. 2 is a flowchart showing an exposure process in the exposure apparatus according to the first embodiment.

A process (exposure process) of transferring the pattern of the original 2 to each shot region on the substrate will now be described with reference to FIG. 2. FIG. 2 is a flowchart showing the exposure process in the exposure apparatus 100 according to the first embodiment.

In step S11, the control unit 10 controls a conveyance unit (not shown) so as to convey, onto the original stage 3, the original 2 where a circuit pattern that should be transferred to each shot region on the substrate is formed and controls the original stage 3 so as to hold the original 2. At this time, the control unit 10 can obtain, from a data save unit 11, information indicating the size of the shot region to which the pattern of the original 2 should be transferred. In step S12, the control unit 10 controls the conveyance unit (not shown) so as to convey the substrate 5 onto the substrate stage 6 and controls the substrate stage 6 so as to hold the substrate 5.

In step S13, the control unit 10 controls the substrate stage 6 such that a shot region of a target (to be referred to as a target shot region hereinafter) to which the pattern of the original 2 is transferred is located below the projection optical system 4. In step S14, the control unit 10 controls a focus measurement unit 7 to measure the height of the substrate 5 in the optical axis direction of the projection optical system 4 and controls the substrate stage 6 such that the surface of the substrate 5 is located at the best focus position of the projection optical system 4. The focus measurement unit 7 can include, for example, an irradiation unit 7a which irradiates the substrate 5 with light and a light-receiving unit 7b which receives light reflected by the substrate 5.

In step S15, the control unit 10 controls a process (exposure process) of transferring the pattern of the original 2 to the target shot region by irradiating the target shot region with light from the illumination optical system 1 via the original 2 and the projection optical system 4. In step S16, the control unit 10 determines whether there is a shot region (next shot region), on the substrate, where the exposure process should be performed continuously. If the control unit 10 determines that there is the next shot region, the process advances to step S17. If the control unit 10 determines that there is not the next shot region, the process advances to step S13. In step S17, the control unit 10 controls the conveyance unit (not shown) so as to recover the original 2 and the substrate 5.

In the exposure apparatus 100 thus configured, a part of exposure light is absorbed in the projection optical system 4, and thus optical characteristics of the projection optical system 4 may fluctuate over an exposure period under the influence of heat generated by the absorption. As a result, it may become difficult to transfer the pattern of the original 2 to the shot region accurately. Therefore, the exposure apparatus 100 obtains, by a prediction formula, a predicted value of the fluctuation amount of the optical characteristics of the projection optical system 4 relative to the exposure period and performs the exposure process while controlling, based on the predicted value, a change unit which changes the optical characteristics. The arrangement of the change unit and a method of calculating the predicted value will be described below.

First, the arrangement of the change unit will be described. The change unit can include, for example, at least one of a driving unit 4b which drives an optical element 4a of the projection optical system 4 and the substrate stage 6. Controlling the driving unit 4b as the change unit is effective when the optical characteristics such as a projection magnification, distortion, focus, curvature of field, difference between the longitudinal magnification and the lateral magnification, and the like of the projection optical system 4 are changed. Controlling the substrate stage 6 as the change unit is effective when the optical characteristics such as the focus of the projection optical system 4 are changed. The driving unit 4b shown in FIG. 1 is configured to drive one optical element 4a. However, the present invention is not limited to this. The driving unit 4b may be configured to drive the plurality of optical elements 4a.

The method of calculating the predicted value will now be described. In the first embodiment, an example will be described in which a predicted value β(t) of a fluctuation amount of the projection magnification of the projection optical system 4 relative to the exposure period is obtained. The predicted value β(t) can be obtained by, for example, a prediction formula (model formula) given by:

$$\beta(t) = C_\beta(1 - \exp(-t/\tau)) \qquad (1)$$

where τ represents a time constant which depends on heat conduction of the optical element 4a of the projection optical system 4, $C_\beta$ represents amplitude of an exponential function, and t represents an exposure period. $C_\beta$ can be obtained by:

$$C_\beta = C_\beta 0 \cdot Tr \cdot SF \cdot I \cdot W_{refl} \qquad (2)$$

where $C_\beta 0$ represents a coefficient for correcting the errors generated in the predicted value, Tr represents transmittance of the original 2, SF represents a coefficient which depends on the size (dimension and/or shape) of the shot region, I represents illuminance, and $W_{refl}$ represents a reflectance of the substrate 5.

Figure 3:
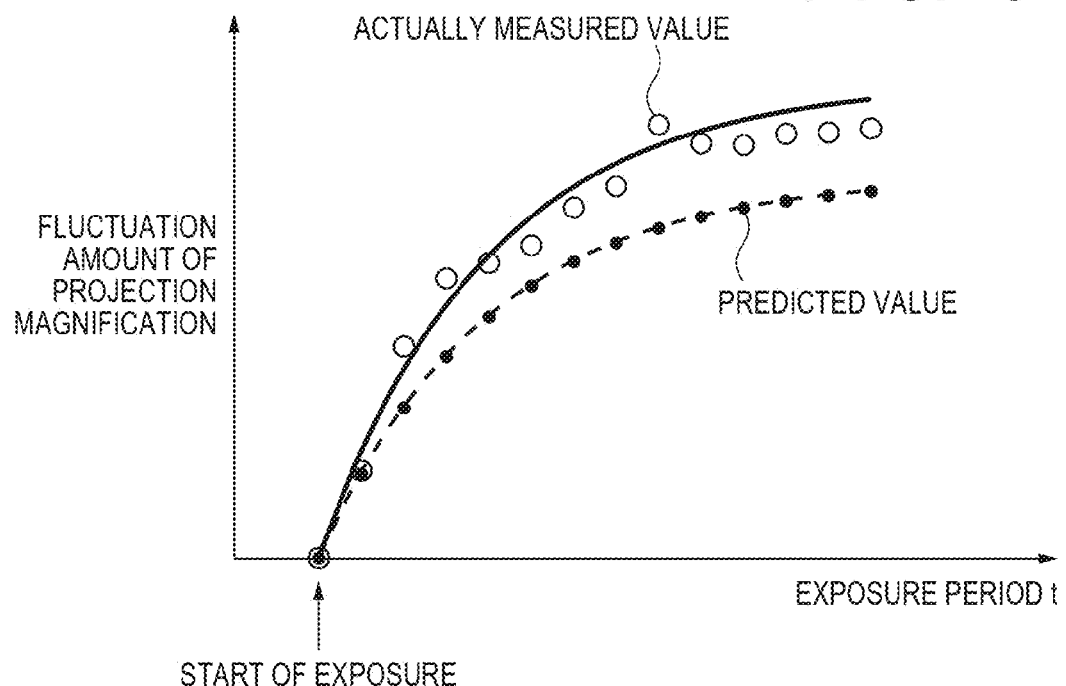
FIG. 3 is a graph showing the relationship between an exposure period and a fluctuation amount of a projection magnification.

Errors with respect to an actually measured value may be generated in the thus obtained predicted value β(t), as shown in FIG. 3. FIG. 3 is a graph showing the relationship between the exposure period and the fluctuation amount of the projection magnification. FIG. 3 shows the predicted value β(t) obtained from formulas (1) and (2), and the actually measured value obtained by an experiment. If the errors with respect to the actually measured value are generated in the predicted value β(t) as described above, it may become difficult to transfer the pattern of the original 2 to each shot region accurately even if the change unit is controlled in accordance with the predicted value β(t).

Therefore, the exposure apparatus 100 obtains an actually measured value βm(t) of the fluctuation amount of the optical characteristics of the projection optical system 4, and obtains the coefficient $C_\beta 0$ by the ratio of the actually measured value βm(t) to the predicted value β(t) as given by:

$$C_\beta 0 = \beta m(t)/\beta(t) \qquad (3)$$

Then, the prediction formula given by formula (1) is determined by correcting formula (2) described above by the obtained coefficient $C_\beta 0$. A step of obtaining the actually measured value βm(t) may be performed, for example, every substrate 5, every predetermined number of substrates 5, or every lot. The coefficient $C_\beta 0$ may be changed each time the actually measured value βm(t) is obtained. However, the coefficient $C_\beta 0$ may be changed after a plurality of actually measured values $\beta m(t)$ different in exposure period are accumulated. In this case, the coefficient $C_\beta 0$ can be obtained by performing a least square fitting on the difference between the actually measured value $\beta m(t)$ and the predicted value $\beta(t)$ per exposure period.

A method of obtaining the actually measured value $\beta m(t)$ of the fluctuation amount of the optical characteristics of the projection optical system 4 will now be described. The fluctuation amount of the optical characteristics of the projection optical system 4 can be measured by, for example, an output from a detection unit 6a provided on the substrate stage 6. The detection unit 6a can include a transmissive portion of a shape corresponding to a mark formed on the object plane of the projection optical system 4 and be configured to detect an image of the mark formed on the image plane by the projection optical system 4 in a TTL method. In the detection unit 6a thus configured, the output of the detection unit 6a reaches its peak when the image of the mark formed on the image plane of the projection optical system 4 matches the transmittance portion. Therefore, by causing the detection unit 6a to detect the image of the mark while moving the substrate stage 6, the control unit 10 can obtain the fluctuation amount of the optical characteristics of the projection optical system 4 based on the coordinate of the substrate stage 6 when the output of the detection unit 6a reaches its peak.

Figure 4:
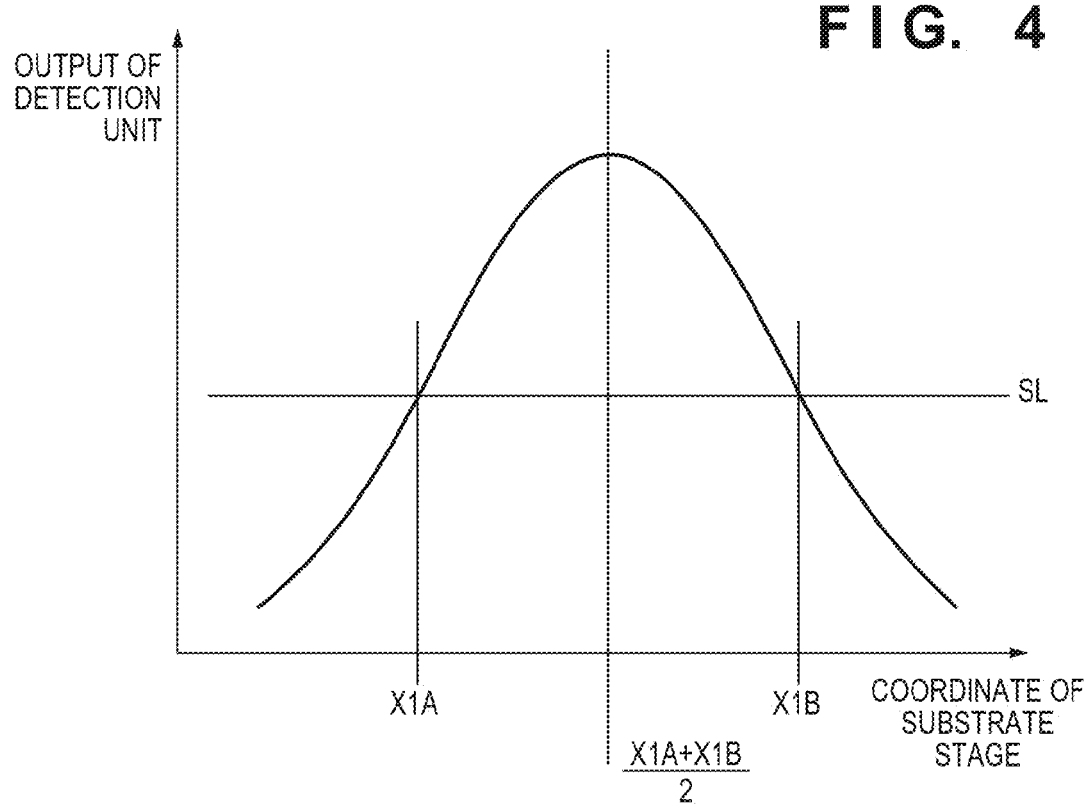
FIG. 4 is a graph showing the relationship between coordinates of a substrate stage and the output of a detection unit.

A waveform as shown in FIG. 4 can be obtained by, for example, causing the detection unit 6a to detect the image of the mark while moving the substrate stage 6. FIG. 4 is a graph showing the relationship between the coordinates (positions) of the substrate stage 6 and the output of the detection unit 6a. The control unit 10 sets an arbitrary level SL to the output of the detection unit 6a, and obtains coordinates X1A and X1B of the substrate stage 6 when the output of the detection unit 6a reaches the level SL. This allows the control unit 10 to obtain, from a formula given by (X1A+X1B)/2, the coordinate of the substrate stage 6 when the output of the detection unit 6a reaches its peak. The control unit 10 may obtain the coordinate of the substrate stage 6 when the output of the detection unit 6a reaches its peak by using, for example, a differentiation other than the above-described method.

Figure 5A:
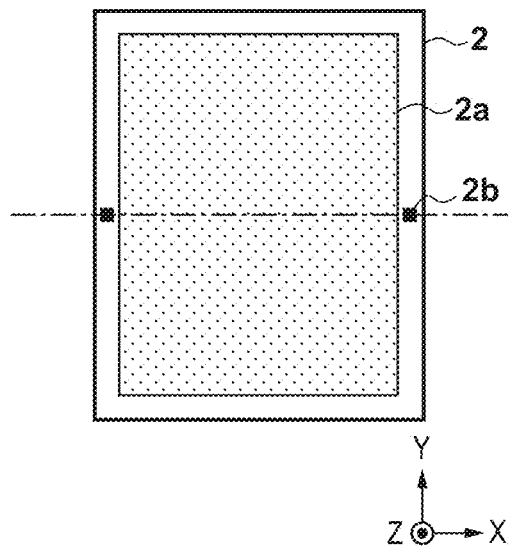
FIG. 5A is a view showing an original having a circuit pattern.
Figure 5B:
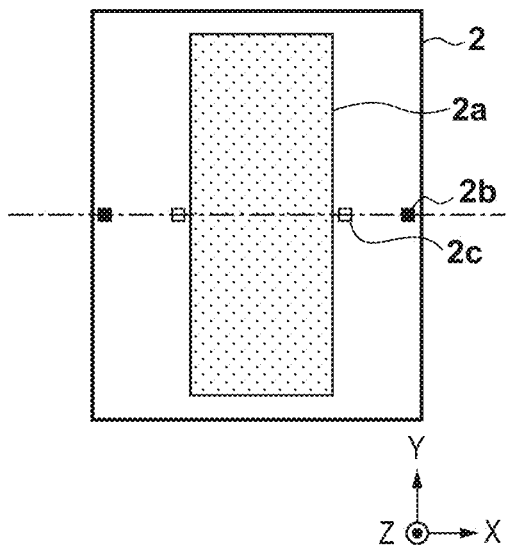
FIG. 5B is a view showing the original having the circuit pattern.

However, if the original 2 having the circuit pattern that should be transferred to the shot region is used when the actually measured value $\beta m(t)$ is obtained as described above, it is impossible to detect the image of the mark in a region, on the image plane of the projection optical system 4, onto which the circuit pattern is projected. Generally, in the original 2 having the circuit pattern, marks 2b used to obtain the actually measured value $\beta m(t)$ can be located outside a circuit pattern formation region 2a, as shown in FIGS. 5A and 5B. Therefore, the detection unit 6a cannot perform detection in the region, on the image plane of the projection optical system 4, to which the circuit pattern is transferred, making it difficult to determine the prediction formula accurately so as to reduce the errors generated in the predicted value $\beta(t)$. Note that FIGS. 5A and 5B are views showing the originals 2 different in dimension in the X direction in the circuit pattern formation region 2a. As shown in FIG. 5B, marks 2c are generally located outside the circuit pattern formation region 2a even if the marks 2c are formed closer to the center of the original 2 than the marks 2b. Therefore, in this case as well, the detection unit 6a cannot perform detection in the region, on the image plane of the projection optical system 4, to which the circuit pattern is transferred.

To cope with this, the exposure apparatus 100 of the first embodiment determines (corrects) the prediction formula by using a dedicated pattern in which a plurality of marks 8a are arranged in a matrix on the object plane of the projection optical system 4. For example, the dedicated pattern is formed on a second original 8 different from the original 2 where the circuit pattern is formed. When the exposure apparatus 100 determines the prediction formula, the original stage 3 holds the second original 8 instead of the original 2. Further, the dedicated pattern is configured such that the marks 8a are located, in the longitudinal direction and the shorter side direction, respectively, in the maximum illuminable region on the object plane of the projection optical system 4, at a pitch shorter than one-tenth of the dimension of that region. In the dedicated pattern thus configured, 100 or more marks 8a can be formed in the maximum illuminable region. In the first embodiment, an example will be described in which the second original 8 having the dedicated pattern in which the marks 8a are arranged in the matrix at 1-mm pitch is used.

Figure 6:
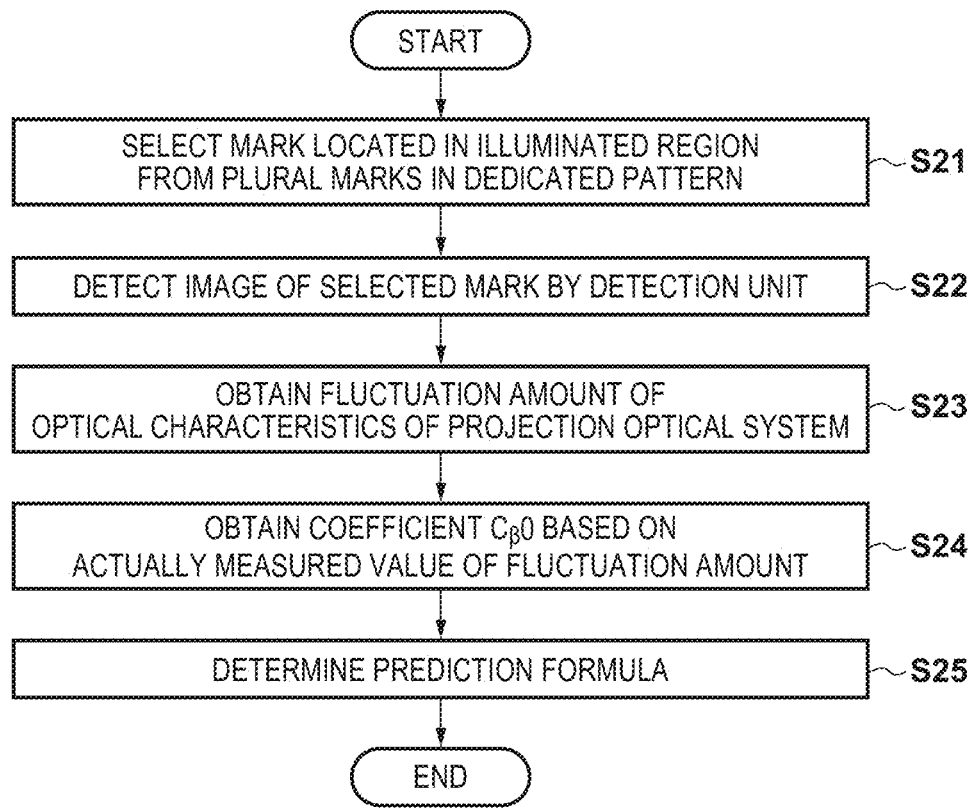
FIG. 6 is a flowchart showing a method of determining a prediction formula.

A method of determining a prediction formula in the exposure apparatus 100 according to the first embodiment will now be described with reference to FIG. 6. FIG. 6 is a flowchart showing the method of determining the prediction formula.

In step S21, the control unit 10 selects, from the plurality of marks 8a in the dedicated pattern, at least two marks 8a located in the illuminated region to be formed on the object plane at the time of the exposure process (when exposing the substrate). For example, the control unit 10 selects the marks 8a based on selection information indicating the locations and number of marks 8a to be selected in the illuminated region 1a for respective items (each item) of the optical characteristics. The illuminated region 1a can be determined based on the information indicating the size of the shot region obtained in step S11. The items of the optical characteristics can include, for example, at least one of the projection magnification, distortion, focus, curvature of field, and difference between the longitudinal magnification and the lateral magnification.

Figure 7A:
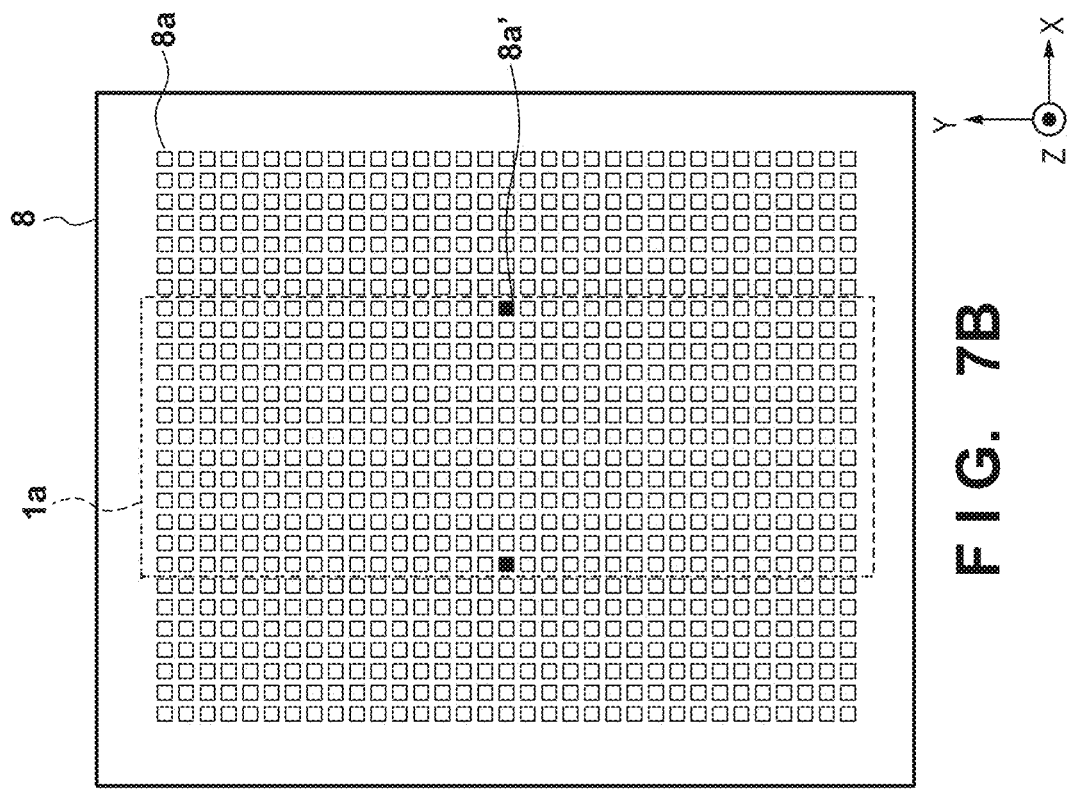
FIG. 7A is a view showing an illuminated region and selected marks in the second original.
Figure 7B:
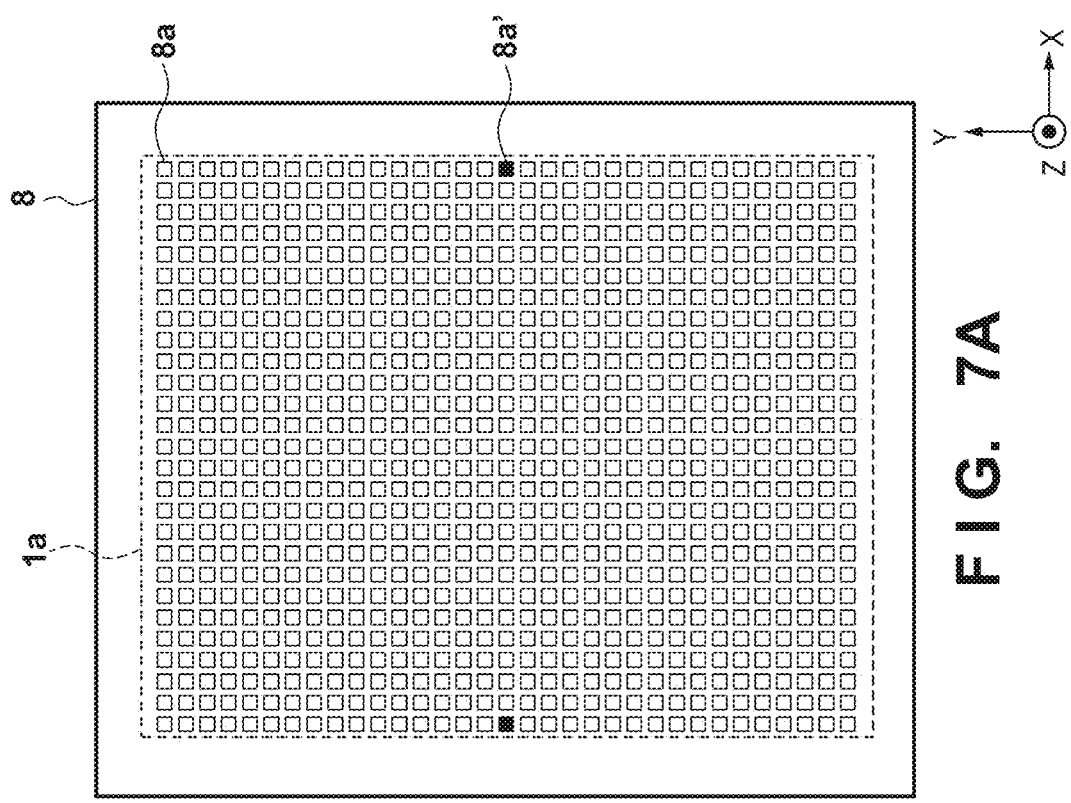
FIG. 7B is a view showing the illuminated region and the selected marks in the second original.

For example, when the item of the optical characteristics is the projection magnification in the X direction, the locations of two marks 8a in the illuminated region having the largest positional difference in the X direction can be set, for the selection information, as the locations of the marks 8a to be selected. Hence, the control unit 10 can select two marks 8a' in the illuminated region as shown in each of FIGS. 7A and 7B by selecting the marks 8a based on the selection information. FIG. 7A is a view showing the illuminated region 1a when the shot region has the largest exposable size and two selected marks 8a'. FIG. 7B is a view showing the illuminated region 1a whose dimension in the X direction is smaller than that in FIG. 7A and two selected marks 8a'.

For example, when the item of the optical characteristics is the projection magnifications in the X direction and the Y direction, the locations of four marks 8a in the illuminated region having the largest positional differences in the X direction and the Y direction can be set, for the selection information, as the locations of the marks 8a to be selected. Hence, the control unit 10 can select four marks 8a' in the illuminated region as shown in each of FIGS. 8A and 8B by selecting the marks 8a based on the selection information. FIG. 8A is a view showing the illuminated region 1a when the shot region has the largest exposable size and four selected marks 8a'. FIG. 8B is a view showing the illuminated region 1a whose dimension in the X direction is smaller than that in FIG. 8A and four selected marks 8a'.

Figure 9A:
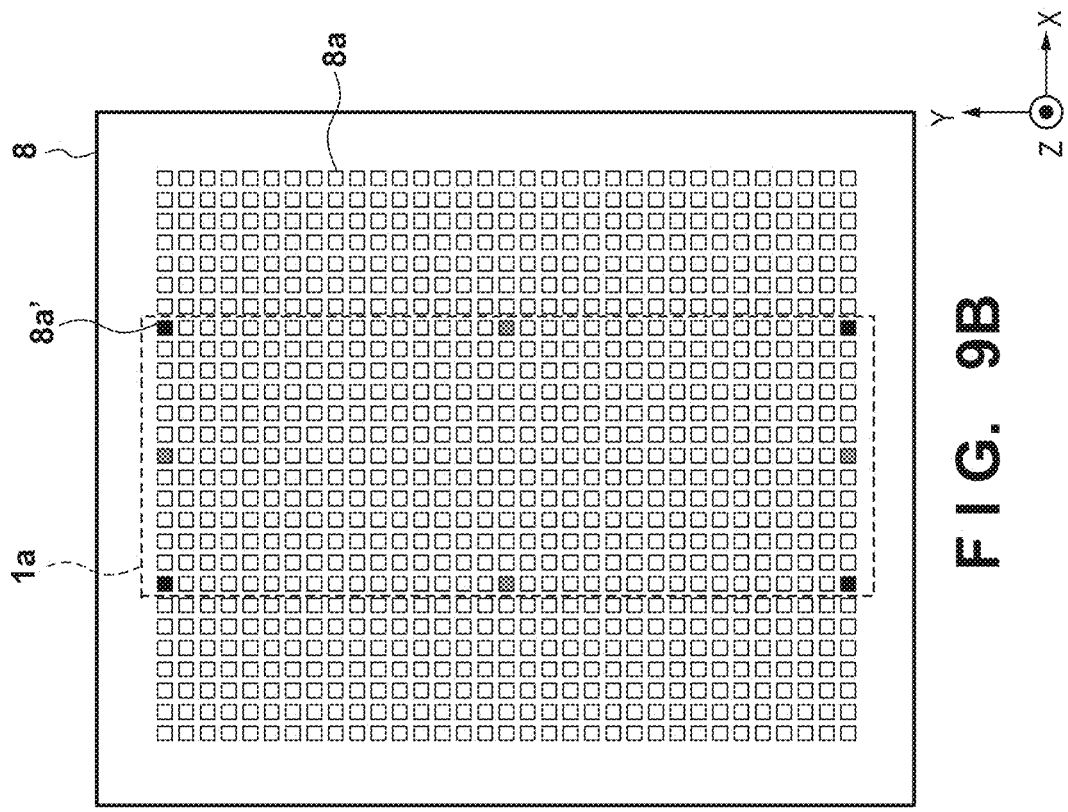
FIG. 9A is a view showing the illuminated region and the selected marks in the second original.
Figure 9B:
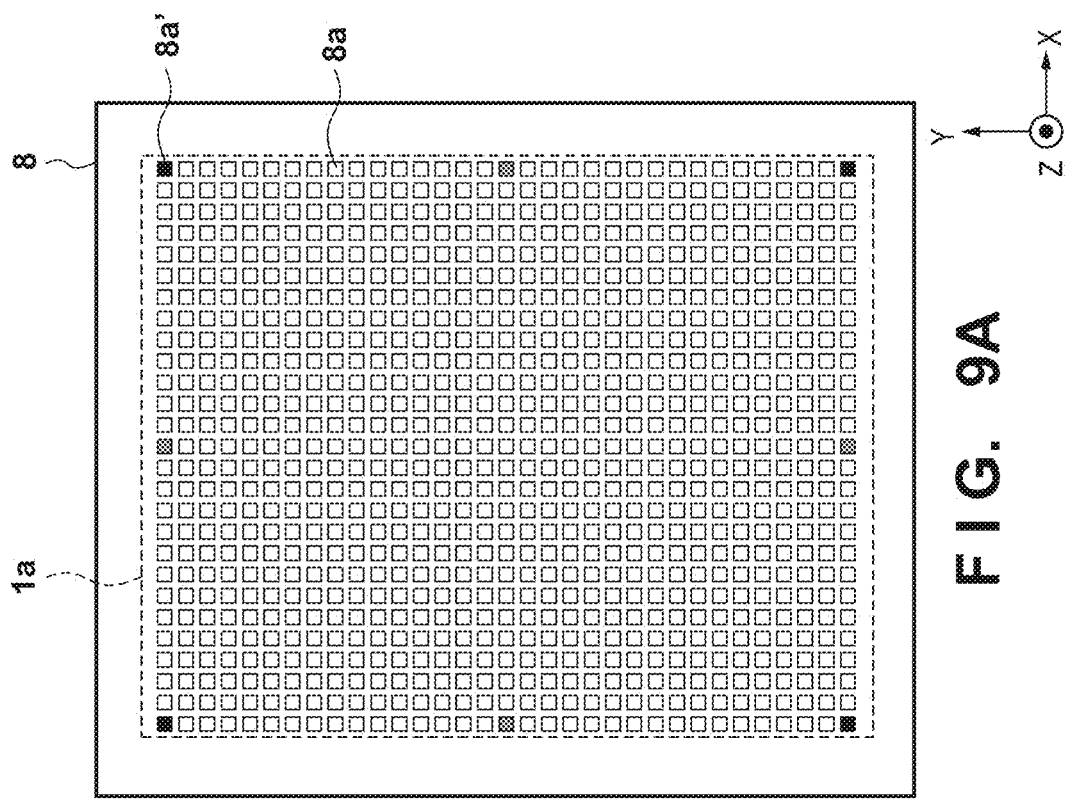
FIG. 9B is a view showing the illuminated region and the selected marks in the second original.

There is a case in which, for example, the projection magnification of the projection optical system 4 is desired to be measured more accurately. In this case, the locations of four marks 8a and the marks 8a at their intermediate positions in the illuminated region having the largest positional differences in the X direction and the Y direction can be set, for the selection information, as the locations of the marks 8a to be selected. Hence, the control unit 10 can select eight marks 8a' in the illuminated region as shown in each of FIGS. 9A and 9B by selecting the marks 8a based on the selection information. FIG. 9A is a view showing the illuminated region 1a when the shot region has the largest exposable size and eight selected marks 8a'. FIG. 9B is a view showing the illuminated region 1a whose dimension in the X direction is smaller than that in FIG. 9A and eight selected marks 8a'.

In the first embodiment, an example has been described in which the control unit 10 selects the marks 8a automatically based on the selection information. However, the present invention is not limited to this. For example, the dedicated pattern may be displayed on a display unit such as a monitor, and a user may select the marks 8a from an input unit such as a mouse or a keyboard.

In step S22, the control unit 10 causes the detection unit 6a to detect images of the marks 8a' selected in step S21 while moving the substrate stage 6. In step S23, based on the output of the detection unit 6a and the coordinates of the substrate stage 6, the control unit 10 obtains positions of the images of the marks 8a' selected in step S21 and obtains the fluctuation amount of the optical characteristics of the projection optical system 4. Then, in step S24, the control unit 10 obtains the coefficient $C_\beta 0$ based on the actually measured value $\beta m(t)$ of the fluctuation amount of the optical characteristics of the projection optical system obtained in step S23, as given by formula (3) described above. For example, the control unit 10 obtains the predicted value $\beta(t)$ by a prediction formula before correction, and obtains the coefficient $C_\beta 0$ based on the ratio of that predicted value $\beta(t)$ and the actually measured value $\beta m(t)$. In step S25, the control unit 10 determines the prediction formula by correcting formula (1) described above with the obtained coefficient $C_\beta 0$.

As described above, the exposure apparatus 100 of the first embodiment determines the prediction formula for predicting the fluctuation amount of the optical characteristics of the projection optical system 4 by using the dedicated pattern in which the plurality of marks 8a are arranged in the matrix on the object plane of the projection optical system 4. It is possible to reduce the errors generated in the predicted value and accurately transfer the pattern of the original 2 to the substrate 5 by obtaining the predicted value of the fluctuation amount of the optical characteristics by using the thus determined prediction formula.

Second Embodiment

In the second embodiment, a method of determining a prediction formula for predicting a fluctuation amount of a distortion of a projection optical system 4 will be described with reference to FIG. 6. In the second embodiment, step S21 different from the first embodiment out of respective steps in a flowchart shown in FIG. 6 will be described.

Figure 10A:
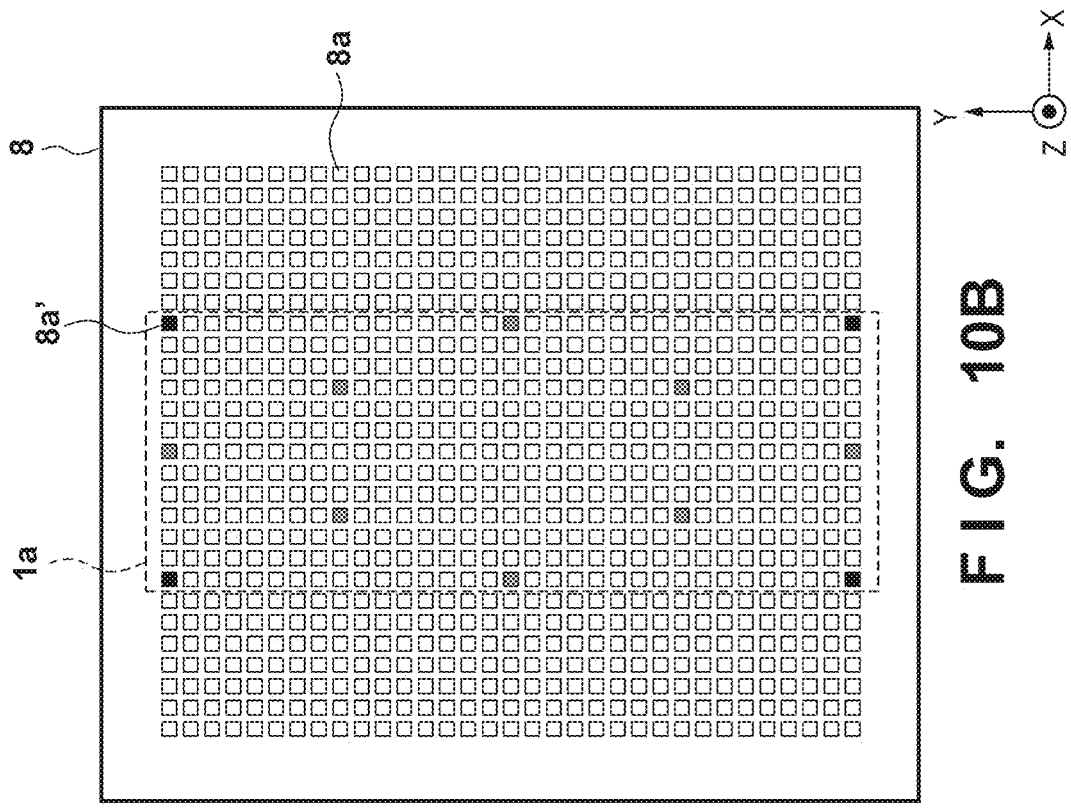
FIG. 10A is a view showing the illuminated region and the selected marks in the second original.
Figure 10B:
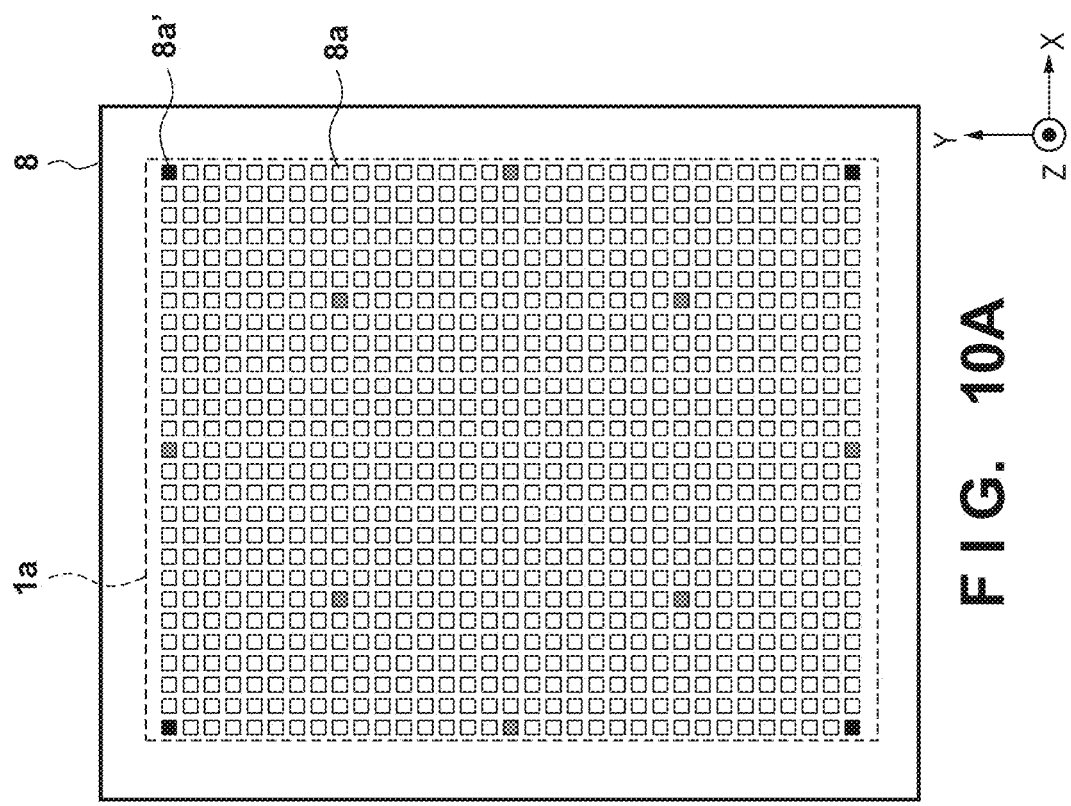
FIG. 10B is a view showing the illuminated region and the selected marks in the second original.

In step S21, a control unit 10 selects, from a plurality of marks 8a in a dedicated pattern, at least two marks 8a located in an illuminated region on an object plane at the time of an exposure process. When the distortion of the projection optical system is measured, the marks 8a larger in number than the marks 8a used to measure a projection magnification may be used. Therefore, when an item of optical characteristics is the distortion, the locations of the marks 8a to be selected are set, for selection information, such that in addition to the marks 8a selected when measuring the projection magnification, the marks 8a closer to the center of the second original 8 than them are also selected. This allows the control unit 10 to select twelve marks 8a' in the illuminated region as shown in FIGS. 10A and 10B by selecting the marks 8a based on the selection information. FIG. 10A is a view showing an illuminated region 1a when a shot region has the largest exposable size and the selected marks 8a'. FIG. 10B is a view showing the illuminated region 1a whose dimension in the X direction is smaller than that in FIG. 10A and the selected marks 8a'.

In each of the first and second embodiments, the example has been described in which correction of the projection magnification and correction of the distortion are performed independently of each other. In general, however, only one of the projection magnification and the distortion does not fluctuate. It is therefore practical to correct both the projection magnification and the distortion. In this case, from a result of the positions of images of the marks 8a (a deviation amount from a target position) obtained in step S23, the projection magnification and the distortion may be separated from each other and quantified by a method such as least square fitting to obtain respective coefficients.

In each of the first and second embodiments, the example has also been described in which the marks are selected based on the size of the illuminated region 1a corresponding to the size of the shot region. However, the control unit 10 may select the marks automatically based on recipe information. In this case, methods of selecting the marks 8a include several methods shown below.

(1) A method of selecting the marks 8a in the illuminated region such that the positional difference in the X direction becomes the largest (for example, the locations of the marks 8a' shown in FIGS. 7A and 7B).

(2) A method of selecting the marks 8a in the illuminated region such that the positional differences in the X direction and the Y direction become the largest (for example, the locations of the marks 8a' shown in FIGS. 8A and 8B).

(3) A method of, in addition to the marks 8a in the illuminated region selected such that the positional differences in the X direction and the Y direction become the largest, also selecting the marks 8a at the intermediate positions of the marks 8a (for example, the locations of the marks 8a' shown in FIGS. 9A and 9B).

(4) A method of, in addition to the marks 8a in the illuminated region selected such that the positional differences in the X direction and the Y direction become the largest, and the marks 8a at the intermediate positions of those marks 8a, also selecting the marks 8a closer to the center (for example, the locations of the marks 8a' shown in FIGS. 10A and 10B).

Third Embodiment

In the third embodiment, correction of a focus position (best focus position) as optical characteristics of a projection optical system 4 will be described. Like a projection magnification of the projection optical system 4, the focus position of the projection optical system 4 can be measured by, for example, the output of a detection unit 6a provided on a substrate stage 6. The output of the detection unit 6a reaches its peak when an image of a mark formed on an image plane of the projection optical system 4 is located at the best focus position of the projection optical system 4. Therefore, a control unit 10 can obtain the best focus position of the projection optical system 4 based on the positional relationship between the projection optical system 4 and the detection unit 6a when the output of the detection unit 6a reaches its peak.

A predicted value F(t) of a fluctuation amount of the focus position of the projection optical system 4 can be obtained by, for example, a prediction formula (model formula) given by:

$$F(t)=C_F(1-\exp(-t/\tau)) \tag{4}$$

where $\tau$ represents a time constant which depends on heat conduction of an optical element of the projection optical system 4, $C_F$ represents amplitude of an exponential function, and t represents an exposure period. $C_F$ can be obtained by:

$$C_F=C_F0\cdot Tr\cdot SF\cdot I\cdot W_{refl} \tag{5}$$

where $C_F0$ represents a coefficient for correcting errors generated in the predicted value, Tr represents transmittance of an original 2, SF represents a coefficient which depends on the size (dimension and/or shape) of a shot region, I represents illuminance, and $W_{refl}$ represents a reflectance of a substrate 5.

Errors with respect to an actually measured value may be generated in the thus obtained predicted value F(t). If the errors with respect to the actually measured value are generated in the predicted value F(t) as described above, it may become difficult to transfer a pattern of the original 2 to each shot region accurately even if a change unit is controlled in accordance with the predicted value F(t). Therefore, also in the third embodiment, as in the first embodiment, an actually measured value Cm(t) of the fluctuation amount of the focus position of the projection optical system 4 is obtained, and the coefficient $C_F0$ is obtained by the ratio of the actually measured value Cm(t) to a predicted value C(t) as given by:

$$C_F0=Cm(t)/C(t) \tag{6}$$

Also in the third embodiment, the predicted value F(t) of the fluctuation amount of the focus position of the projection optical system is determined by using a dedicated pattern in which a plurality of marks are arranged in a matrix on an object plane of the projection optical system 4. A description of a method of determining the prediction formula is the same as that in the first embodiment given with reference to FIG. 6, and thus is omitted. Note that in the third embodiment, at least one of a driving unit 4b which drives the optical element of the projection optical system 4 and the substrate stage 6 can be used as a change unit which changes the optical characteristics of the projection optical system 4. For example, when the driving unit 4b is used as the change unit, the control unit 10 controls, based on the predicted value F(t) obtained by the prediction formula, the driving unit 4b to change the focus position of the projection optical system 4 such that the substrate 5 is located at the best focus position of the projection optical system 4. When the substrate stage 6 is used as the change unit, the control unit 10 controls, based on the predicted value F(t), the substrate stage 6 to change the distance between the substrate and the projection optical system 4 such that the substrate 5 is located at the best focus position of the projection optical system 4.

<Embodiment of Article Manufacturing Method>

An article manufacturing method according to an embodiment of the present invention is suitable for manufacturing an article, for example, a microdevice such as a semiconductor device or an element having a microstructure. The article manufacturing method according to this embodiment includes a step of forming a latent image pattern on a photoresist applied to a substrate using the above-described exposure apparatus (a step of exposing a substrate), and a step of developing the substrate with the latent image pattern formed in the step. The manufacturing method further includes other known steps (oxidation, deposition, vapor deposition, doping, planarization, etching, resist removal, dicing, bonding, and packaging). The article manufacturing method according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-158496 filed on Aug. 10, 2015, which is hereby incorporated by reference herein in its entirety.

What is claimed is:

1. An evaluation method of evaluating optical characteristics of a projection optical system, by using a prediction formula for predicting a fluctuation amount of the optical characteristics relative to an exposure period of a substrate via the projection optical system, the method comprising:
   determining the prediction formula by using a dedicated pattern in which a plurality of marks are arranged in a matrix on an object plane of the projection optical system, wherein the determining includes
selecting, based on information on an illuminated region on the object plane determined in accordance with a size of a shot region on the substrate, at least two marks from marks to be located in the illuminated region among the plurality of marks, and
obtaining the prediction formula based on positions of images of the at least two marks formed on an image plane of the projection optical system.

2. The method according to claim 1, wherein in the determining, the prediction formula is determined by using an original where the dedicated pattern has been formed.

3. The method according to claim 1, wherein in the obtaining, a coefficient included in the predication formula is obtained based on an actually measured value of the optical characteristics obtained from the positions of the images of the at least two marks.

4. The method according to claim 1, wherein in the dedicated pattern, not less than 100 marks are located in a maximum illuminable region on the object plane.

5. The method according to claim 1, wherein in the dedicated pattern, the marks are located, in a longitudinal direction and a shorter side direction, respectively, in a maximum illuminable region on the object plane, at a pitch shorter than one-tenth of a dimension of the region.

6. The method according to claim 1, wherein in the selecting, based on information on conditions for locations and number of marks to be selected in the illuminated region for respective items of the optical characteristics, the at least two marks to be used for item of the optical characteristics to be evaluated are selected.

7. The method according to claim 6, wherein the items of the optical characteristics include at least one of a projection magnification, a distortion, a focus, curvature of field, and a difference between a longitudinal magnification and a lateral magnification.

8. The method according to claim 1, wherein the determining includes obtaining information on the size of the shot region to be exposed and determining the illuminated region based on the obtained size of the shot region.

9. A non-transitory computer-readable storage medium storing a program for causing a computer to execute each step of an evaluation method of evaluating optical characteristics of a projection optical system, by using a prediction formula for predicting a fluctuation amount of the optical characteristics relative to an exposure period of a substrate via the projection optical system, the method comprising:
determining the prediction formula by using a dedicated pattern in which a plurality of marks are arranged in a matrix on an object plane of the projection optical system,
wherein the determining includes
selecting, based on information on an illuminated region on the object plane determined in accordance with a size of a shot region on the substrate, at least two marks from marks to be located in the illuminated region among the plurality of marks, and
obtaining the prediction formula based on positions of images of the at least two marks formed on an image plane of the projection optical system.

10. An exposure apparatus which exposes a substrate, the apparatus comprising:
a projection optical system configured to project a pattern of the original onto the substrate;
a change unit configured to change optical characteristics of the projection optical system; and
a control unit configured to determine, by using a dedicated pattern where a plurality of marks are arranged in a matrix on an object plane of the projection optical system, a prediction formula for predicting a fluctuation amount of the optical characteristics relative to an exposure period, and control the change unit based on the predicted fluctuation amount by the prediction formula,
wherein the control unit
selects, based on information on an illuminated region on the object plane determined in accordance with a size of a shot region on the substrate, at least two marks from marks to be located in the illuminated region among the plurality of marks, and
obtains the prediction formula based on positions of images of the at least two marks formed on an image plane of the projection optical system.

11. An exposure method of exposing a substrate via a projection optical system, the method comprising:
determining, by using a dedicated pattern where a plurality of marks are arranged in a matrix on an object plane of the projection optical system, a prediction formula for predicting a fluctuation amount of optical characteristics of the projection optical system relative to an exposure period; and
exposing the substrate via the projection optical system by adjusting the optical characteristics of the projection optical system based on the predicted fluctuation amount by the prediction formula,
wherein the determining includes
selecting, based on information on an illuminated region on the object plane determined in accordance with a size of a shot region on the substrate, at least two marks from marks to be located in the illuminated region among the plurality of marks, and
obtaining the prediction formula based on positions of images of the at least two marks formed on an image plane of the projection optical system.

12. A method of manufacturing an article, the method comprising:
exposing a substrate using an exposure method of exposing a substrate via a projection optical system;
developing the exposed substrate; and
processing the developed substrate to manufacture the article,
wherein the exposure method includes:
determining, by using a dedicated pattern where a plurality of marks are arranged in a matrix on an object plane of the projection optical system, a prediction formula for predicting a fluctuation amount of optical characteristics of the projection optical system relative to an exposure period; and
exposing the substrate via the projection optical system by adjusting the optical characteristics of the projection optical system based on the predicted fluctuation amount by the prediction formula,
wherein the determining includes
selecting, based on information on an illuminated region on the object plane determined in accordance with a size of a shot region on the substrate, at least two marks from marks to be located in the illuminated region among the plurality of marks, and
obtaining the prediction formula based on positions of images of the at least two marks formed on an image plane of the projection optical system.

13. The method according to claim 1, wherein the illuminated region is determined so as to illuminate a region in which a circuit pattern of an original to be transferred onto the shot region is arranged.

14. The method according to claim 1, wherein the at least two marks to be selected in the selecting are changed in accordance with a size of the illuminated region.

* * * * *